(12) United States Patent
Xia et al.

(10) Patent No.: US 6,472,333 B2
(45) Date of Patent: Oct. 29, 2002

(54) SILICON CARBIDE CAP LAYERS FOR LOW DIELECTRIC CONSTANT SILICON OXIDE LAYERS

(75) Inventors: Li-Qun Xia, Santa Clara; Paul Fisher, Los Altos; Margaret Lynn Gotuaco, San Francisco, all of CA (US); Frederic Gaillard, Meylan (FR); Ellie Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/820,439

(22) Filed: Mar. 28, 2001

(65) Prior Publication Data

US 2002/0142578 A1 Oct. 3, 2002

(51) Int. Cl.[7] .............................. H01L 21/31
(52) U.S. Cl. ................. 438/758; 438/756; 438/780; 438/783; 257/842; 257/750
(58) Field of Search .................. 438/783, 758, 438/780, 756; 257/842, 750; 427/255

(56) References Cited

U.S. PATENT DOCUMENTS

| | | | |
|---|---|---|---|
| 4,262,631 A | 4/1981 | Kubacki | 118/723 |
| 4,532,150 A | 7/1985 | Endo et al. | 427/39 |
| 4,634,601 A | 1/1987 | Hamakawa et al. | 427/39 |
| 4,759,947 A | 7/1988 | Ishihara et al. | 427/38 |
| 5,204,141 A * | 4/1993 | Roberts et al. | 427/255.3 |
| 5,238,866 A | 8/1993 | Bolz et al. | 437/100 |
| 5,465,680 A | 11/1995 | Loboda | 117/84 |

(List continued on next page.)

FOREIGN PATENT DOCUMENTS

EP 0 613 178 8/1994 ............ H01L/21/90

OTHER PUBLICATIONS

U.S. patent application Ser. No. 09/465233, Yau, et al. filed Dec. 16, 1999.
U.S. patent application Ser. No. 09/370371, Yau, et al. filed Aug. 09, 1999.
U.S. patent application Ser. No. 09/338470, Moghadam, et al. filed Jun. 22, 1999.
U.S. patent application Ser. No. 09/329012, Bjorkman, et al. filed Jun. 09, 1999.
U.S. patent application Ser. No. 09/553461, Huang, et al. filed Apr. 19, 2000.
U.S. patent application Ser. No. 09/679843, Gaillard, et al. filed Oct. 05, 2000.
U.S. patent application Ser. No. 09/477126, Yau, et al. filed Dec. 30, 1999.
U.S. patent application Ser. No. 09/580,505, Cheung, et al. filed May 25, 2000.
U.S. patent application Ser. No. 09/594186, Cheung, et al. filed Jun. 13, 2000.
U.S. patent application Ser. No. 09/957551, Cheung, et al. filed Sep. 19, 2001.

(List continued on next page.)

Primary Examiner—John F. Niebling
Assistant Examiner—Olivia Luk
(74) Attorney, Agent, or Firm—Moser, Patterson & Sheridan

(57) ABSTRACT

A method of forming a low dielectric constant silicate material for use in integrated circuit fabrication processes is disclosed. The low dielectric constant silicate material is formed by reacting by reacting a gas mixture comprising an organosilane compound, an oxygen source, and an inert gas. Thereafter, a silicon carbide cap layer is formed on the silicate material by reacting a gas mixture comprising a silicon source and a carbon source. The silicon carbide cap layer protects the underlying organosilicate layer from cracking and peeling when it is hardened during a subsequent annealing step.

27 Claims, 6 Drawing Sheets

U.S. PATENT DOCUMENTS

| | | | |
|---|---|---|---|
| 5,554,485 A | * 9/1996 | Dichiara et al. | 430/271.1 |
| 5,711,987 A | 1/1998 | Bearinger et al. | 427/7 |
| 5,730,792 A | 3/1998 | Camilletti et al. | 106/287.14 |
| 5,755,886 A | * 5/1998 | Wang et al. | 118/715 |
| 5,776,235 A | 7/1998 | Camilletti et al. | 106/287.1 |
| 5,780,163 A | 7/1998 | Camilletti et al. | 428/446 |
| 5,818,071 A | 10/1998 | Loboda et al. | 257/77 |
| 5,963,840 A | * 10/1999 | Xia et al. | 438/783 |
| 6,054,379 A | 4/2000 | Yau et al. | 438/623 |
| 6,072,227 A | * 6/2000 | Yau et al. | 257/642 |
| 6,140,226 A | 10/2000 | Grill et al. | 438/637 |
| 6,147,009 A | 11/2000 | Grill et al. | 438/780 |
| 6,159,871 A | 12/2000 | Loboda et al. | 438/786 |
| 6,232,662 B1 | * 5/2001 | Saran | 257/750 |
| 6,245,690 B1 | * 6/2001 | Yau et al. | 438/780 |
| 6,265,321 B1 | * 7/2001 | Chooi et al. | 438/725 |
| 6,271,146 B1 | * 8/2001 | Ross | 438/723 |
| 6,287,990 B1 | 9/2001 | Cheung et al. | 438/780 |
| 6,303,523 B2 | 10/2001 | Cheung et al. | 438/780 |

OTHER PUBLICATIONS

U.S. patent application Ser. No. 09/579819, Cheung, et al. filed May 25, 2000.

U.S. patent application Ser. No. 09/594187, Cheung, et al. filed Jun. 13, 2000.

U.S. patent application Ser. No. 09/957681, Cheung, et al. filed Sep. 19, 2001.

U.S. patent application Ser. No. 09/247381, Cheung, et al. filed Feb. 10, 1999.

* cited by examiner

US 6,472,333 B2

SILICON CARBIDE CAP LAYERS FOR LOW DIELECTRIC CONSTANT SILICON OXIDE LAYERS

BACKGROUND OF THE DISCLOSURE

1. Field of the Invention

The present invention relates to silicon carbide layers and, more particularly to their use in integrated circuit fabrication processes.

2. Description of the Background Art

Integrated circuits have evolved into complex devices that can include millions of components (e. g., transistors, capacitors, and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e. g., sub-micron dimensions), the materials used to fabricate such components contribute to their electrical performance. For example, low resistivity metal interconnects (e. g., copper (Cu) and aluminum (Al)) provide conductive paths between the components on integrated circuits. Typically, the metal interconnects are electrically isolated from each other by an insulating material. When the distance between adjacent metal interconnects and/or the thickness of the insulating material has sub-micron dimensions, capacitive coupling potentially occurs between such interconnects. Capacitive coupling between adjacent metal interconnects may cause cross-talk and/or resistance-capacitance (RC) delay which degrades the overall performance of the integrated circuit.

In order to minimize capacitive coupling between adjacent metal interconnects, low dielectric constant bulk insulating materials (e. g., dielectric constants less than about 3.0) are needed. Examples of low dielectric constant bulk insulating materials include organosilicates, silicon oxides, and fluorosilicate glass (FSG), among others.

Typically, some bulk insulating materials are deposited using low temperature chemical vapor deposition (CVD) or spin-on processes. These bulk insulating material layers may have poor mechanical strength (e. g., hardness of less than about 0.3 GPa (gigapascals)).

Post-deposition annealing processes may be used to improve the mechanical strength of such bulk insulating material layers. Cap layers comprising an oxide or silicon nitride (SiN) material may be deposited on the bulk insulating material layers prior to annealing to protect the bulk insulating material layer from being scratched when the semiconductor wafer is moved between process chambers. However, oxide or silicon nitride cap layers are impermeable to outgassing of carbon, hydrogen and/or oxygen species from the bulk insulating material, causing such cap layers to undesirably bubble and/or crack during the annealing process.

Therefore, a need exists for cap layers for use on low dielectric constant bulk insulating material annealing processes.

SUMMARY OF THE INVENTION

A method of forming a low dielectric constant silicate material for use in integrated circuit fabrication processes is provided. The low dielectric constant silicate material is formed by reacting by reacting a gas mixture comprising an organosilane compound, an oxygen source, and an inert gas. Thereafter, a silicon carbide cap layer is formed on the silicate material by reacting a gas mixture comprising a silicon source and a carbon source. The silicon carbide cap layer protects the underlying organosilicate layer from cracking and peeling when it is hardened during a subsequent annealing step.

The low dielectric constant silicate layer is compatible with integrated circuit fabrication processes. In one integrated circuit fabrication process, the low dielectric silicate layer is incorporated into a damascene structure. For such an embodiment, a preferred process sequence includes depositing a barrier layer on a substrate. A first low dielectric constant silicate layer along with a first silicon carbide cap layer are formed on the barrier layer. Thereafter, a second low dielectric constant silicate layer as well as a second silicon carbide cap layer are formed on the first silicate layer and first silicon carbide cap layer. The second silicon carbide cap layer is patterned to define vias therethrough. After the vias are defined through the second silicon carbide cap layer, such pattern is transferred through the second low dielectric constant silicate layer as well as the first silicon carbide cap layer using the second silicon carbide cap layer as a hard mask. Thereafter, the second silicon carbide layer is patterned to define interconnects therethrough. The interconnects formed in the second silicon carbide cap layer are positioned over the vias previously formed therethrough. After the interconnect pattern is defined through the second silicon carbide cap layer, the interconnect pattern is transferred through the second low dielectric constant silicate layer, while simultaneously transferring the via pattern through the first low dielectric constant silicate layer. The damascene structure is completed by filling the interconnects and vias with a conductive material.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
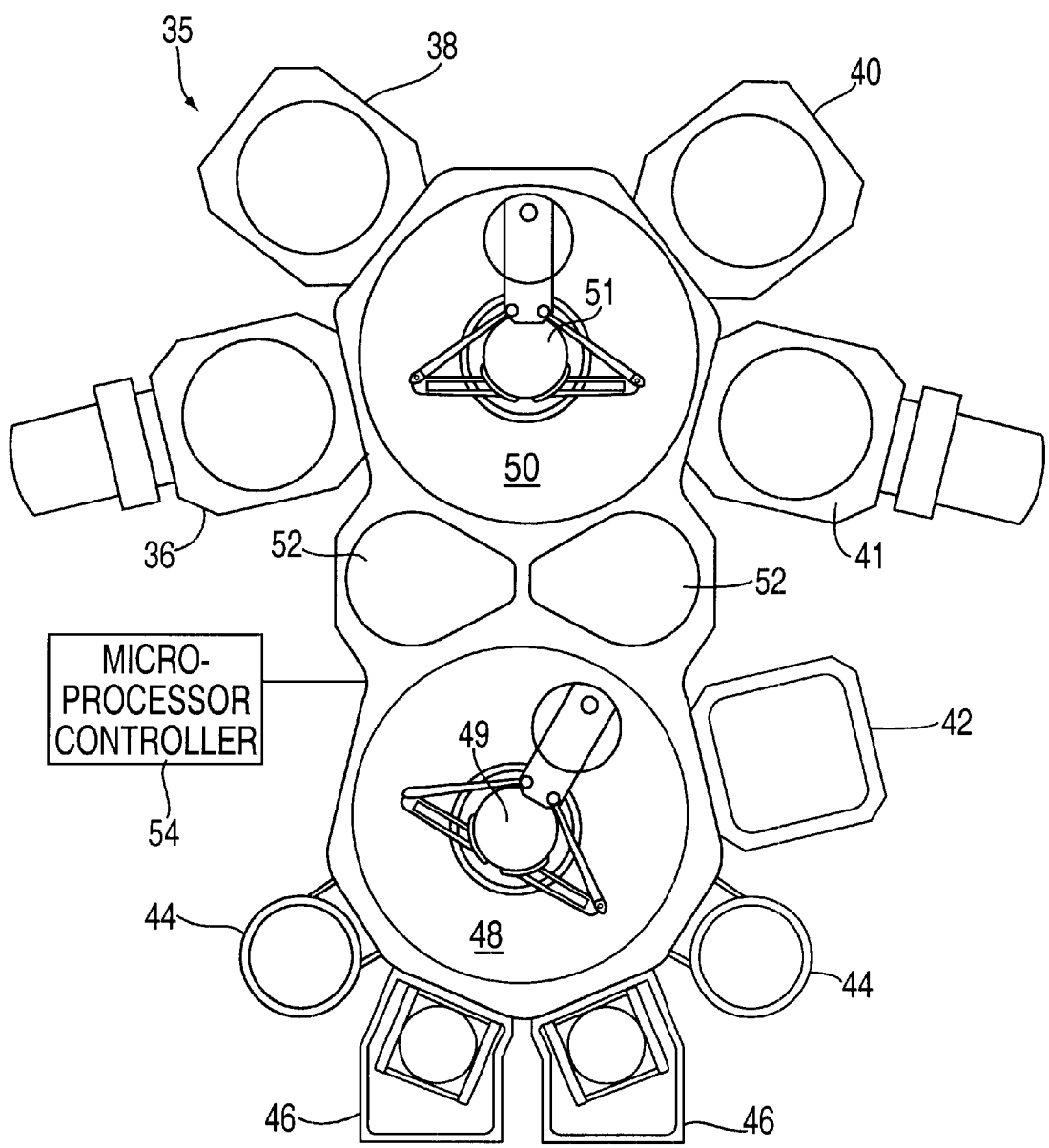
FIG. 1 depicts a schematic illustration of an apparatus that can be used for the practice of embodiments described herein.

FIG. 1 is a schematic representation of a wafer processing system 35 that can be used to perform integrated circuit fabrication in accordance with embodiments described herein. The wafer processing system 35 typically comprises process chambers 36, 38, 40, 41, degas chambers 44, load-lock chambers 46, transfer chambers 48, 50, pass-through chambers 52, a microprocessor controller 54, along with other hardware components such as power supplies (not shown) and vacuum pumps (not shown). An example of such a wafer processing system 35 is an ENDURA® System, commercially available from Applied Materials, Inc., Santa Clara, Calif.

Details of the wafer processing system 35 are described in commonly assigned U. S. Pat. No. 5,186,718, entitled "Staged-Vacuum Substrate Processing System and Method", issued Feb. 16, 1993, and is hereby incorporated by reference. The salient features of the wafer processing system 35 are briefly described below.

The wafer processing system 35 includes two transfer chambers 48, 50, each containing a transfer robot 49, 51. The transfer chambers 48, 50 are separated one from the other by pass-through chambers 52.

Transfer chamber 48 is coupled to load-lock chambers 46, degas chambers 44, pre-clean chamber 42, and pass-through chambers 52. Substrates (not shown) are loaded into the wafer processing system 35 through load-lock chambers 46. Thereafter, the substrates are sequentially degassed and cleaned in degas chambers 44 and the pre-clean chamber 42, respectively. The transfer robot 48 moves the substrates between the degas chambers 44 and the pre-clean chamber 42.

Transfer chamber 50 is coupled to a cluster of process chambers 36, 38, 40, 41. The cleaned substrates are moved from transfer chamber 48 into transfer chamber 50 via pass-through chambers 52. Thereafter, transfer robot 51 moves the substrates between one or more of the process chambers 36, 38, 40, 41.

The process chambers 36, 38, 40, 41 are used to perform various integrated circuit fabrication sequences. For example, process chambers 36, 38, 40, 41 may include chemical vapor deposition (CVD) chambers, rapid thermal process (RTP) chambers, physical vapor deposition (PVD) chambers, ionized metal plasma physical vapor deposition (IMP PVD) chambers, and anti-reflective coating (ARC) chambers, among others.

Figure 2:
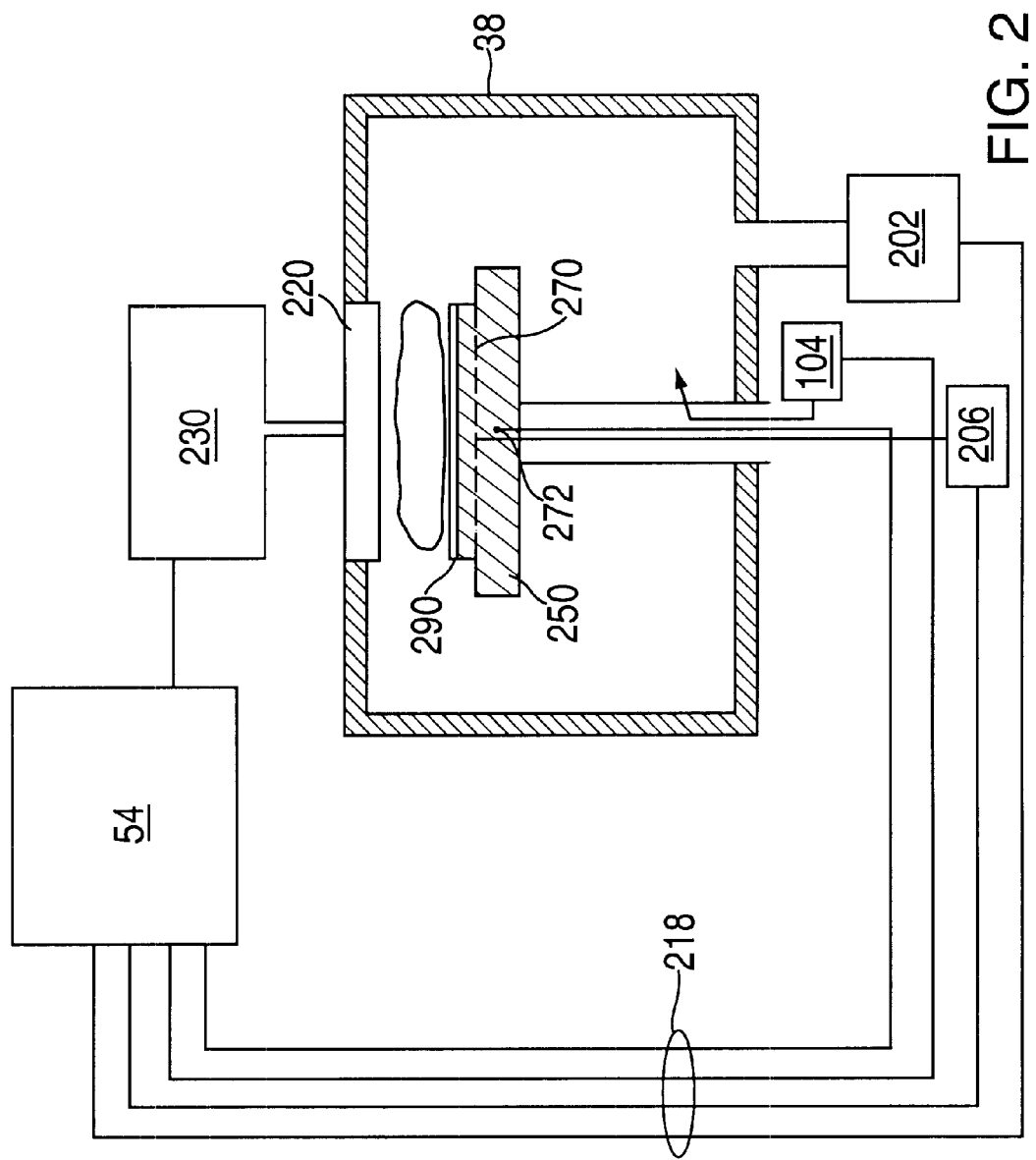
FIG. 2 depicts a schematic cross-sectional view of a chemical vapor deposition (CVD) chamber.

FIG. 2 depicts a schematic cross-sectional view of a chemical vapor deposition (CVD) process chamber 36 of wafer processing system 35. Examples of such CVD process chambers 36 include DXZ™ chambers, and PRECISION 5000® chambers, commercially available from Applied Materials, Inc., Santa Clara, Calif.

The CVD process chamber 36 generally houses a wafer support pedestal 250, which is used to support a substrate 290. The wafer support pedestal 250 can typically be moved in a vertical direction inside the CVD process chamber 36 using a displacement mechanism (not shown).

Depending on the specific CVD process, the substrate 290 can be heated to some desired temperature prior to or during deposition. For example, the wafer support pedestal 250 may be heated by an embedded heater element 270. The wafer support pedestal 250 may be resistively heated by applying an electric current from an AC power supply 206 to the heater element 270. The substrate 290 is, in turn, heated by the pedestal 250.

A temperature sensor 272, such as a thermocouple, is also embedded in the wafer support pedestal 250 to monitor the temperature of the pedestal 250 in a conventional manner. The measured temperature is used in a feedback loop to control the AC power supply 206 for the heating element 270, such that the substrate temperature can be maintained or controlled at a desired temperature which is suitable for the particular process application. The wafer support pedestal 250 is optionally heated using radiant heat (not shown).

A vacuum pump 202 is used to evacuate the CVD process chamber 36 and to maintain the proper gas flows and pressures inside such chamber 36. A showerhead 220, through which process gases are introduced into the chamber 36, is located above the wafer support pedestal 250. The showerhead 220 is connected to a gas panel 230, that controls and supplies various gases provided to the chamber 36.

Proper control and regulation of the gas flows through the gas panel 230 is performed by mass flow controllers (not shown) and a microprocessor controller 54 (FIG. 1). The showerhead 220 allows process gases from the gas panel 230 to be uniformly introduced and distributed in the CVD process chamber 36.

The CVD process chamber 36 may comprise additional components for enhancing layer deposition on the substrate 290. For example, the showerhead 220 and wafer support pedestal 250 may also form a pair of spaced apart electrodes. When an electric field is generated between these electrodes, the process gases introduced into the chamber 36 are ignited into a plasma.

Typically, the electric field is generated by coupling the wafer support pedestal 250 to a source of radio frequency (RF) power (not shown) through a matching network (not shown). Alternatively, the RF power source and matching network may be coupled to the showerhead 220, or coupled to both the showerhead 220 and the wafer support pedestal 250.

Plasma enhanced chemical vapor deposition (PECVD) techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

Figure 3:
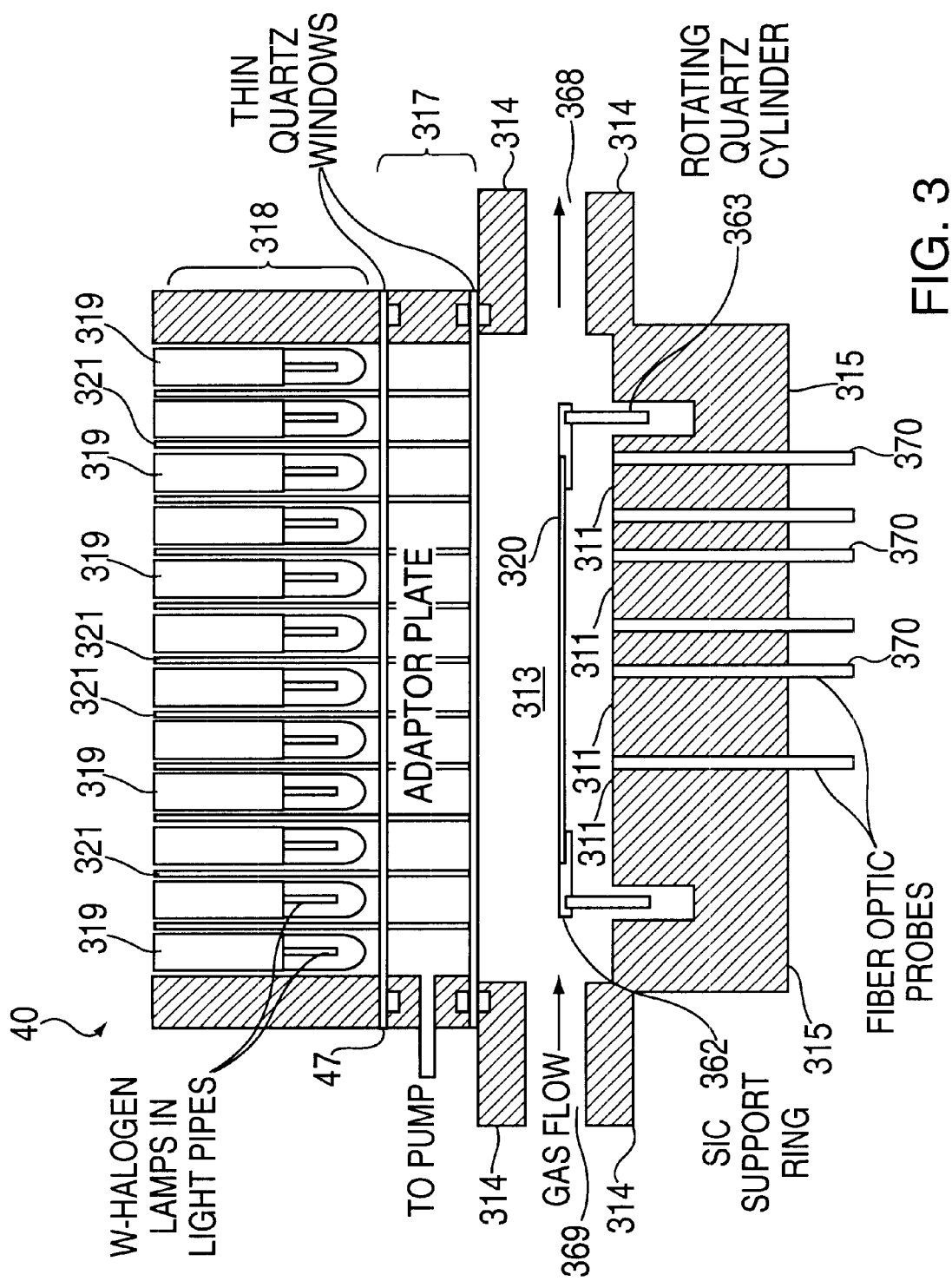
FIG. 3 depicts a schematic cross-sectional view of a rapid thermal processor (RTP) chamber.

FIG. 3 depicts a schematic cross-sectional view of a rapid thermal processor (RTP) chamber 40 of wafer processing system 35. An example of a RTP chamber 40 is a CENTURA® chamber, commercially available from Applied Materials, Inc., Santa Clara, Calif.

The RTP chamber 40 includes sidewalls 314, a bottom 315, and a window assembly 317. The sidewalls 314 and the bottom 315 generally comprise a metal such as, for example, stainless steel. The upper portions of sidewalls 314 are sealed to window assembly 317 by o-rings 316. A radiant energy assembly 318 is positioned over and coupled to window assembly 317. The radiant energy assembly 318 includes a plurality of lamps 319 each mounted to a light pipe 321.

The RTP chamber 40 houses a substrate 320 supported around its perimeter by a support ring 362 made of, for example, silicon carbide. The support ring 362 is mounted on a rotatable cylinder 363. The rotatable cylinder 363 causes the support ring 362 and the substrate to rotate within the RTP chamber 40.

The bottom 315 of chamber 40 includes a gold-coated top surface 311, which reflects light energy onto the backside of the substrate 320. Additionally, the RTP chamber 40 includes a plurality of temperature probes 370 positioned through the bottom 315 of RTP chamber 40 to detect the temperature of the substrate 320.

A gas inlet 369 through sidewall 314 provides process gases to the RTP chamber 40. A gas outlet 368 positioned through sidewall 314 opposite to gas inlet 369 removes process gases from the RTP chamber 40. The gas outlet 368 is coupled to a pump system (not shown) such as a vacuum source. The pump system exhausts process gases from the RTP chamber 40 and maintains a desired pressure therein during processing.

The radiant energy assembly 318 preferably is configured so the lamps 319 are positioned in a hexagonal array or in a "honeycomb" arrangement, above the surface area of the substrate 320 and the support ring 362. The lamps 319 are grouped in zones that may be independently controlled, to uniformly heat the substrate 320.

The window assembly 317 includes a plurality of short light pipes 341 that are aligned to the light pipes 321 of the radiant energy assembly 318. Radiant energy from the lamps 321 is provided via light pipes 321, 341 to the process region 313 of RTP chamber 40.

Referring to FIG. 1, the CVD process chamber 36 and the RTP chamber 40 as described above are each controlled by a microprocessor controller 54. The microprocessor controller 54 may be one of any form of general purpose computer processor (CPU) that can be used in an industrial setting for controlling various chambers and sub-processors. The computer may use any suitable memory, such as random access memory, read only memory, floppy disk drive, hard disk, or any other form of digital storage, local or remote. Various support circuits may be coupled to the CPU for supporting the processor in a conventional manner. Software routines as required may be stored in the memory or executed by a second CPU that is remotely located.

The software routines are executed after the substrate is positioned on the pedestal. The software routines, when executed, transform the general purpose computer into a specific process computer that controls the chamber operation so that a chamber process is performed. Alternatively, the software routines may be performed in hardware, as an application specific integrated circuit or other type of hardware implementation, or a combination of software or hardware.

Low Dielectric Constant Organosilicate Layer and Silicon Carbide Cap Layer Deposition The low dielectric constant organosilicate layer is formed by reacting a gas mixture comprising an organosilane compound, an oxygen source, and an inert gas. The organosilane compound may have the general formula $Si(CH_3)_a H_{4-a}$ where a has a range between 1 and 4. For example, methylsilane ($SiCH_6$), dimethylsilane ($SiC_2H_8$), trimethylsilane ($SiC_3H_{10}$) and tetramethylsilane ($SiC_4H_{12}$) may be used as the organosilane compound.

Oxygen ($O_2$), ozone ($O_3$), nitrous oxide ($N_2O$), carbon monoxide (CO), carbon dioxide ($CO_2$), or combinations thereof, among others, may be used as the oxygen source. Helium (He), argon (Ar), and combinations thereof, among others, may be used as the inert gas.

In general, the following deposition process parameters may be used to form the organosilicate layer using a CVD process chamber similar to that shown in FIG. 2. The process parameters range from a wafer temperature of about 50° C. to about 250° C., a chamber pressure of about 1 torr to about 500 torr, an organosilane compound gas flow rate of about 50 sccm to about 1000 sccm, an oxygen source gas flow rate of about 10 sccm to about 1000 sccm, and an inert gas flow rate of about 1000 sccm to about 10,000 sccm. The above process parameters provide a deposition rate for the organosilicate layer in a range of about 0.1 micron/minute to about 2 microns/minute when implemented on a 200 mm (millimeter) substrate in a deposition chamber available from Applied Materials, Inc.

After the organosilicate layer is formed, a silicon carbide cap layer is deposited thereon. The silicon carbide cap layer may be formed by reacting a gas mixture comprising a silicon source and a carbon source.

The silicon source and the carbon source may be an organosilane compound having the general formula $Si_xC_yH_z$, where x has a range from 1 to 2, y has a range from 1 to 6, and z has a range from 4 to 18. For example, methylsilane ($SiCH_6$), dimethylsilane ($SiC_2H_8$), trimethylsilane ($SiC_3H_{10}$), tetramethylsilane ($SiC_4H_{12}$), and diethylsilane ($SiC_4H_{12}$), among others may be used as the organosilane compound. Alternatively, silane ($SiH_4$), disilane ($Si_2H_6$), methane ($CH_4$), and combinations thereof, may be used as the silicon source.

Helium (He), argon (Ar), nitrogen ($N_2$), or combinations thereof, among others, may be used for the inert gas.

In general, the following deposition process parameters can be used to form the silicon carbide cap layer. The process parameters range from a wafer temperature of about 150° C. to about 450° C., a chamber pressure of about 1 torr to about 15 torr, a silicon source/carbon source flow rate of about 10 sccm to about 2000 sccm, an inert gas flow rate of less than about 1000 sccm, a plate spacing of about 300 mils to about 600 mils, and one or more RF powers of about 1 watt/cm$^2$ to about 500 watts/cm$^2$. The above process parameters provide a deposition rate for the silicon carbide layer in a range of about 100 Å/minute to about 3000 Å/minute when implemented on a 200 mm (millimeter) substrate in a deposition chamber available from Applied Materials, Inc., located in Santa Clara, Calif.

Other deposition chambers are within the scope of the invention, and the parameters listed above may vary according to the particular deposition chamber used to form either of the organosilicate layer and the silicon carbide cap layer. For example, other deposition chambers may have a larger (e. g., configured to accommodate 300 mm substrates) or smaller volume, requiring gas flow rates that are larger or smaller than those recited for deposition chambers available from Applied Materials, Inc.

The as-deposited silicon carbide cap layer has a hardness of about 5 Gpa, which is about ten times harder than the underlying organosilicate layer. As such, the silicon carbide cap layer protects the underlying organosilicate layer from being scratched when the semiconductor wafer is moved between process chambers, prior to a subsequent annealing step.

Additionally, the silicon carbide cap layer is permeable to the outgassing of carbon, hydrogen and/or oxygen containing species from the underlying organosilicate layer. As such, the silicon carbide cap layer does not bubble, crack, or peel when the underlying organosilicate layer is annealed.

After the silicon carbide is formed on the organosilicate layer, the organosilicate layer is annealed. Nitrogen ($N_2$) and oxygen ($O_2$), among others, may be used as the annealing gas. Inert gases such as argon (Ar) and helium (He), among others may be used for the inert gas. It is believed that annealing the organosilicate layer improves both the mechanical strength of such organosilicate layers as well as the dielectric properties thereof.

In general, the following process parameters may be used to anneal the organosilicate layer in a process chamber similar to that shown in FIG. 3. The process parameters range from a wafer temperature of about 200° C. to about 500° C. and an annealing gas flow rate of about 1000 sccm to about 10,000 sccm. The organosilicate layer is annealed for less than about 60 minutes.

The as-deposited organosilicate layer has a dielectric constant that is less than about 3.0, making it suitable for use as an insulating material in integrated circuits. The dielectric constant of the organosilicate layer is tunable in that it can be varied in a range between about 2.0 to about 3.0 as a function of the reaction temperature. In particular, as the reaction temperature is increased, the dielectric constant of the as-deposited layer decreases.

The dielectric constant of the organosilicate layer can also be tuned as a function of the composition of the gas mixture during layer formation.

As the carbon (C) concentration in the gas mixture increases, the C content of the as-deposited organosilicate layer increases, decreasing its dielectric constant.

Integrated Circuit Fabrication Processes

Figure 4A:
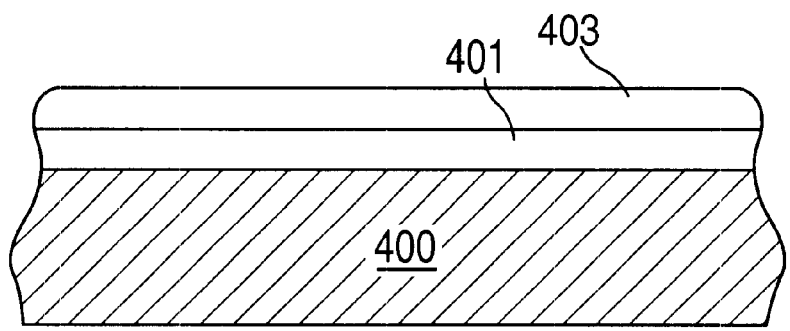
FIGS. 4a–4j depict schematic cross-sectional views of a damascene structure at different stages of integrated circuit fabrication incorporating a silicon carbide cap layer.

Damascene Structure Incorporating a Low Dielectric Constant Organosilicate Layer having a Silicon Carbide Cap Layer FIGS. 4a–4j illustrate schematic cross-sectional views of a substrate 400 at different stages of a damascene structure fabrication sequence incorporating an organosilicate layer having a silicon carbide cap layer thereon. Damascene structures are typically used to form metal interconnects on integrated circuits. Depending on the specific stage of processing, substrate 400 may correspond to a silicon substrate, or other material layer that has been formed on the substrate 400. FIG. 4a, for example, illustrates a cross-sectional view of a substrate 400 having conductive leads 401 and a barrier layer 403 formed thereon. The conductive leads 401 may be a metal (e. g., aluminum (Al), copper (Cu)). The barrier layer 403 may be a low dielectric constant material (e. g., silicon carbide).

FIG. 4a illustrates one embodiment in which the substrate 400 is silicon having copper (Cu) leads 401 formed thereon. The copper leads 401 has a thickness of about 5,000 Å to about 5 microns depending on the size of the structure to be fabricated. A barrier layer 403 is formed on the copper leads 401. The barrier layer 403 may be a silicon carbide layer. The barrier layer 403 has a thickness of about 200 Å to about 1,000 Å.

Figure 4B:
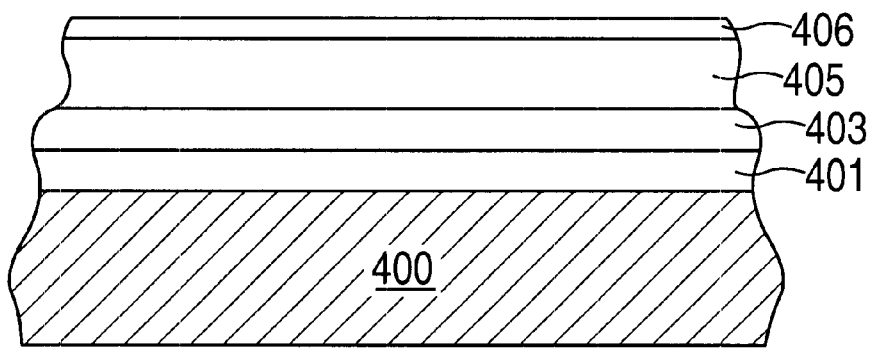

Referring to FIG. 4b, a first silicate layer 405 is formed on the barrier layer 403. The first silicate layer 405 is formed on the barrier layer 403 according to the process parameters described above. The thickness of the first silicate layer 405 is variable depending on the specific stage of processing. Typically, the first silicate layer 405 has a thickness of about 5,000 Å to about 10,000 Å.

A first cap layer 406 is formed on the first silicate layer 405. The first cap layer 406 is a silicon carbide layer formed according to the process parameters described above. The thickness of the first cap layer 406 is variable depending on the specific stage of processing. Typically, the first cap layer 406 has a thickness of about 200 Å to about 1,000 Å. After the first cap layer 406 is formed on the first silicate layer 405, the first silicate layer 405 is annealed according to the process parameters described above.

Figure 4C:
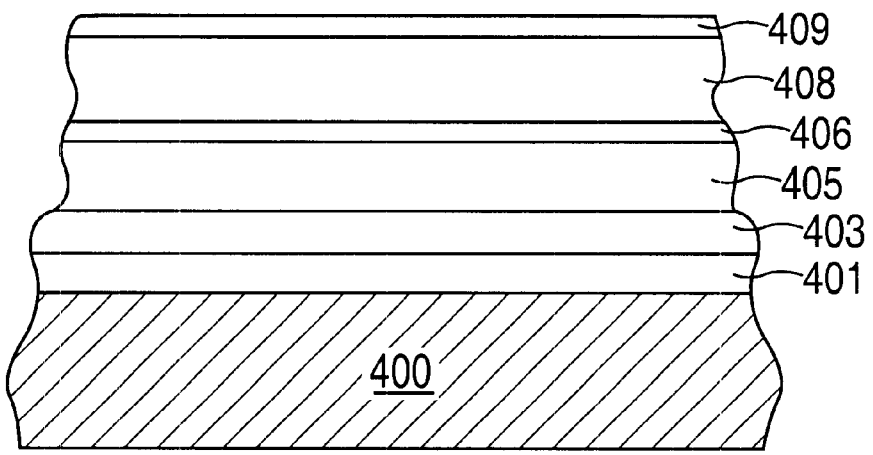

Referring to FIG. 4c, after the first silicate layer 405 is annealed a second silicate layer 408 is formed on the first cap layer 406. The second silicate layer 408 is deposited according to the process parameters described above. The thickness of the second silicate layer 408 is variable depending on the specific stage of processing. Typically, the second silicate layer 408 has a thickness of about 5,000 Å to about 10,000 Å.

A second cap layer 409 is formed on the second silicate layer 408. The second cap layer 409 is a silicon carbide layer formed according to the process parameters described above. The thickness of the second cap layer 409 is variable depending on the specific stage of processing. Typically, the second cap layer 409 has a thickness of about 200 Å to about 1,000 Å. After the second cap layer 409 is formed on the second silicate layer 408, the second silicate layer 408 is annealed according to the process parameters described above.

Figure 4D:
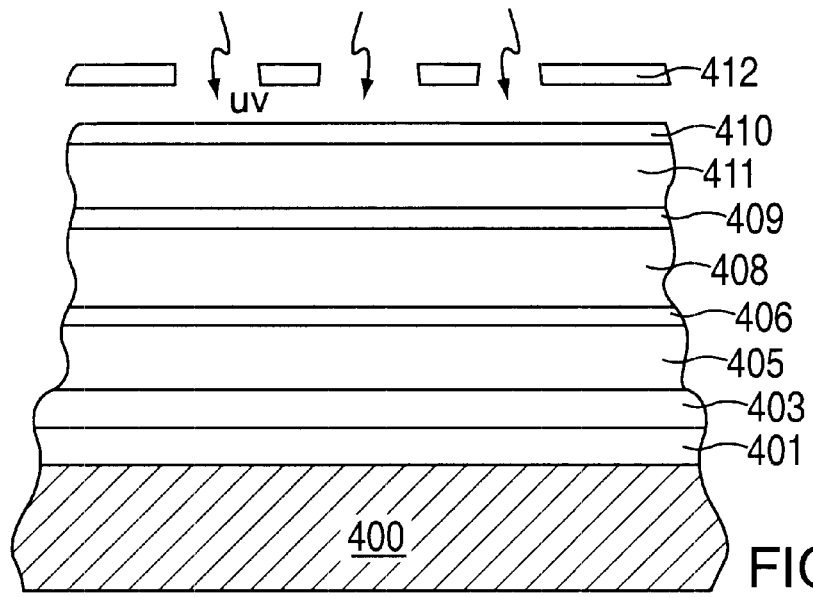

Referring to FIG. 4d, a layer of energy sensitive resist material 410 is formed on the second cap layer 409. The layer of energy sensitive resist material 410 may be spin coated on the substrate to a thickness within a range of about 4,000 Å to about 10,000 Å. Most energy sensitive resist materials are sensitive to ultraviolet (UV) radiation having a wavelength less than about 450 nm (nanometers). Deep ultraviolet (DUV) resist materials are sensitive to UV radiation having wavelengths less than about 250 nm.

Dependant on the etch chemistry of the energy sensitive resist material used in the fabrication sequence, an intermediate layer 411 may be formed on the second cap layer 409. When the energy sensitive resist material 410 and the second cap layer 409 can be etched using the same chemical etchants or when resist poisoning may occur, the intermediate layer 411 functions as a mask for the second cap layer 409. The intermediate layer 411 is conventionally formed on the second cap layer 409. The intermediate layer 411 may be an oxide, amorphous silicon, or other suitable material layer.

Figure 4E:
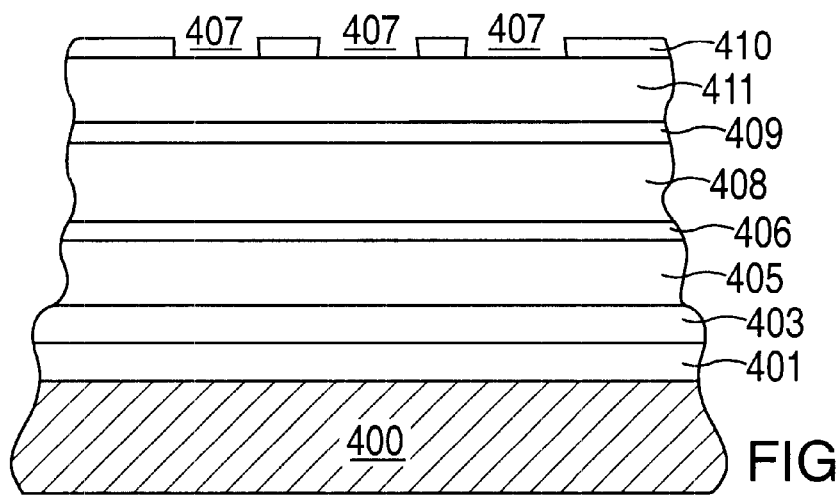

An image of a via pattern 407 is introduced into the layer of energy sensitive resist material 410 by exposing such energy sensitive resist material 410 to UV radiation via mask 412. The image of the via pattern 407 introduced into the layer of energy sensitive resist material 410 is developed in an appropriate developer to define the via pattern 407 therethrough, as shown in FIG. 4e.

Figure 4F:
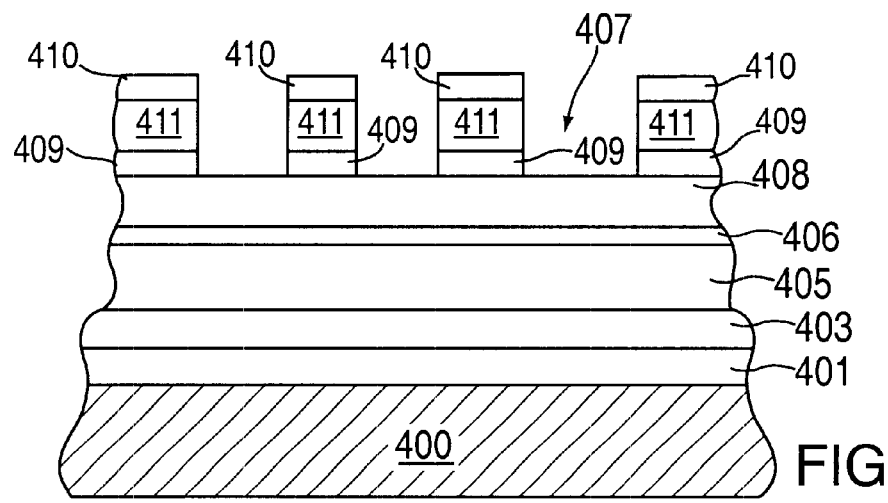

Thereafter, referring to FIG. 4f, the via pattern 407 defined in the energy sensitive resist material 410 is transferred through the second cap layer 409. The via pattern 407 is transferred through the second cap layer 409 using the energy sensitive resist material 410 as a mask. The via pattern 407 is transferred through the second cap layer 409 using an appropriate chemical etchant. For example, fluorocarbon compounds such as trifluoromethane ($CHF_3$) may be used to chemically etch a silicon carbide cap layer.

Alternatively, when the intermediate layer 411 is present, the via pattern 407 defined in the energy sensitive resist material 410 is first transferred through the intermediate layer 411 using the energy sensitive resist material 410 as a mask. Thereafter, the via pattern 407 is transferred through the second cap layer 409 using the intermediate layer 411 as a mask. The via pattern 407 is transferred through both the intermediate layer 411 and the second cap layer 409 using appropriate chemical etchants.

Figure 4G:
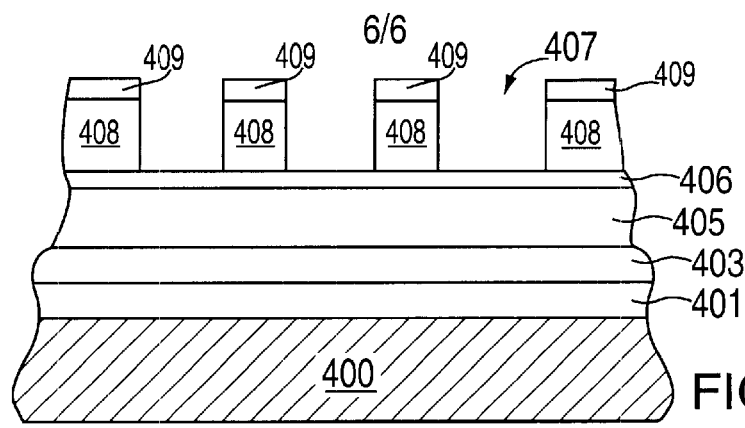

Thereafter, referring to FIG. 4g, the via pattern 407 is transferred through the second silicate layer 408 using the second cap layer 409 as a mask. The via pattern 407 is transferred through the second silicate layer 408 using an appropriate chemical etchant. For example, carbon tetrafluoride ($CF_4$), fluoroethane ($C_2F_6$), and fluorobutene ($C_4F_8$) may be used to chemically etch the second silicate layer 408.

Figure 4H:
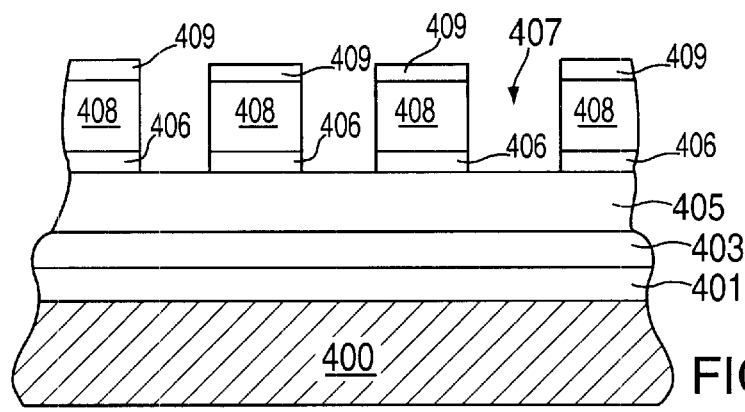

After the via pattern 407 is transferred through the second silicate layer 408, interconnect lines 412 are define in the second cap layer 409, as illustrated in FIG. 4h, preferably using conventional lithography processes described above. The interconnect lines 412 formed in the second cap layer 409 are positioned over the vias 407 formed in the second silicate layer 408. When the interconnect lines 412 are defined in the second cap layer, the via pattern 407 transferred through the first cap layer 406.

Figure 4I:
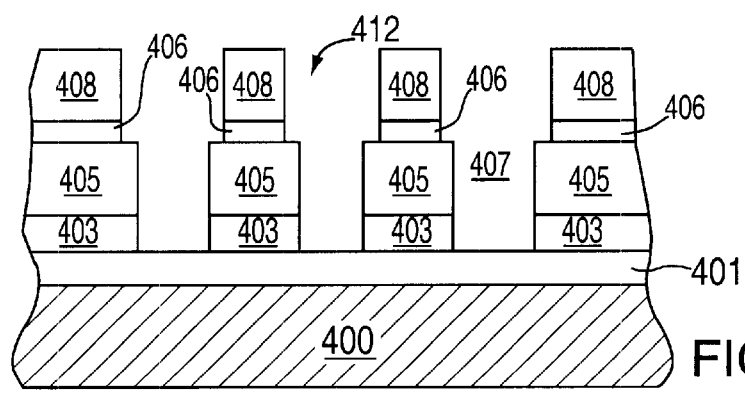

Thereafter, as shown in FIG. 4i, the interconnect lines 412 are transferred through the second silicate layer 408, while the vias 407 are transferred through the first silicate layer 405 using an appropriate chemical etchant.

Figure 4J:
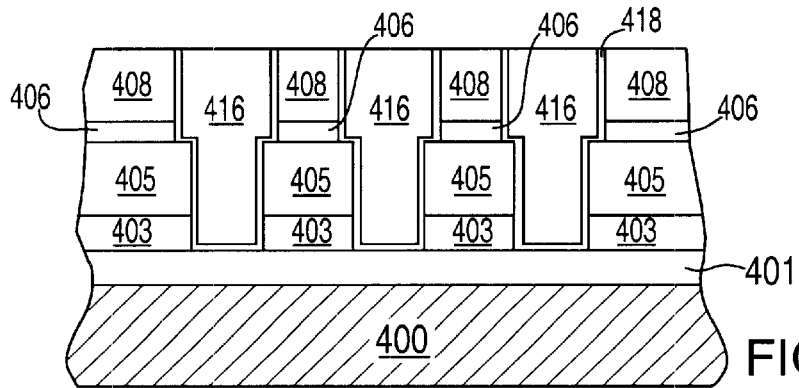

Referring to FIG. 4j, the interconnect lines 412 and the vias 407 are filled with a conductive material 416 such as aluminum (Al), copper (Cu), tungsten (W), or combinations thereof. Preferably copper (Cu) is used to fill the interconnect lines 412 and the vias 407 due to its low resistivity (resistivity of about 1.7 μω-cm). The conductive material 416 may be deposited using chemical vapor deposition (CVD) techniques, physical vapor deposition (PVD) techniques, electroplating techniques, or combinations thereof, to form the damascene structure.

Additionally, a barrier layer 418 such as tantalum (Ta), tantalum nitride (TaN), or other suitable barrier material may be deposited conformably on the sidewalls of the interconnect lines 412 and the vias 407, before filling them with the conductive material 416, to prevent metal migration into the surrounding first and second silicate layers 405, 408, as well as the first and second cap layers 406, 409.

Although several preferred embodiments which incorporate the teachings of the present invention have been shown and described in detail, those skilled in the art can readily devise many other varied embodiments that still incorporate these teachings.

What is claimed is:

1. A method of thin film deposition for integrated circuit fabrication, comprising:
   forming a silicon, oxygen, and carbon containing layer on a substrate;
   forming a silicon carbide cap layer on the silicon, oxygen, and carbon containing layer; and then
   annealing the silicon, oxygen, and carbon containing layer and the silicon carbide cap layer.

2. The method of claim 1, wherein the silicon, oxygen, and carbon containing layer and the silicon carbide cap layer are annealed using an annealing gas comprising nitrogen ($N_2$) and oxygen ($O_2$).

3. The method of claim 2, wherein the annealing gas further comprises one or more inert gases selected from the group of helium (He) and argon (Ar).

4. The method of claim 1, wherein the annealing is performed at a temperature within a range of about 200° C. to about 500° C.

5. The method of claim 2, wherein the annealing gas is provided at a flow rate within a range of about 1000 sccm to about 10,000 sccm.

6. The method of claim 1, wherein the silicon, oxygen, and carbon containing layer is formed by:
   providing a gas mixture comprising a silicon source, a carbon source, and an oxygen source; and
   thermally decomposing the gas mixture.

7. The method of claim 6, wherein the silicon source and the carbon source comprise an organosilane compound having the general formula $Si(CH_3)_a H_{4-a}$, where a has a range between 1 and 4.

8. The method of claim 7, wherein the organosilane compound is selected from the group of methylsilane ($SiCH_6$), dimethylsilane ($SiC_2H_8$), trimethylsilane ($SiC_3H_{10}$), tetramethylsilane ($SiC_4H_{12}$), and combinations thereof.

9. The method of claim 6, wherein the oxygen source is selected from the group of nitrous oxide ($N_2O$), oxygen ($O_2$), ozone ($O_3$), carbon monoxide (CO), carbon dioxide ($CO_2$), and combinations thereof.

10. The method of claim 6, wherein the silicon, oxygen, and carbon containing layer is formed at a pressure between about 1 torr to about 500 torr.

11. The method of claim 7, wherein the organosilane compound is provided at a flow rate in a range of about 50 sccm to about 1,000 sccm.

12. The method of claim 6, wherein the oxygen source is provided at a flow rate in a range of about 10 sccm to about 1000 sccm.

13. The method of claim 6, wherein the silicon, oxygen, and carbon containing layer is formed at a temperature between about 50° C. to about 250° C.

14. The method of claim 6, wherein the gas mixture further comprises an inert gas.

15. The method of claim 14, wherein the inert gas is selected from the group of helium (He), argon (Ar), and combinations thereof.

16. The method of claim 14, wherein the inert gas is provided at a flow rate in a range of about 1,000 sccm to about 10,000 sccm.

17. The method of claim 1, wherein the silicon carbide cap layer is formed by:
   providing a second gas mixture comprising a second silicon source and a second carbon source; and
   reacting the second gas mixture in the presence of an electric field.

18. The method of claim 17, wherein the second silicon source and the second carbon source comprise a second organosilane compound having the general formula $Si_xC_yH_z$, where x has a range between 1 and 2, y has a range between 1 and 6, and z has a range between 4 and 18.

19. The method of claim 18, wherein the second organosilane compound is selected from the group of methylsilane ($SiCH_8$), dimethylsilane ($SiC_2H_8$), trimethylsilane ($SiC_3H_{10}$), tetramethylsilane ($SiC_4H_{12}$), and combinations thereof.

20. The method of claim 17, wherein the electric field is generated by the application of a radio frequency (RF) power.

21. The method of claim 20, wherein the RF power is within the range of about 1 watt/cm$^2$ to about 500 watts/cm$^2$.

22. The method of claim 17, wherein the silicon carbide cap layer is formed at a pressure between about 1 torr to about 15 torr.

23. The method of claim 18, wherein the second organosilane compound is provided at a flow rate in a range of about 10 scam to about 2,000 sccm.

24. The method of claim 17, wherein the silicon carbide cap layer is formed at a temperature between about 150° C. to about 450° C.

25. The method of claim 17, wherein the second gas mixture further comprises an inert gas.

26. The method of claim 25, wherein the inert gas is selected from the group of helium (He), argon (Ar), nitrogen ($N_2$), and combinations thereof.

27. The method of claim 25, wherein the inert gas is provided at a flow rate less than about 1,000 sccm.

* * * * *

UNITED STATES PATENT AND TRADEMARK OFFICE
CERTIFICATE OF CORRECTION

PATENT NO. : 6,472,333 B2
DATED : October 29, 2002
INVENTOR(S) : Li-Qun Xia et al.

It is certified that error appears in the above-identified patent and that said Letters Patent is hereby corrected as shown below:

<u>Title page,</u>
Item [57], ABSTRACT, please change "by reacting by reacting" to
-- by reacting --.

<u>Column 1,</u>
Line 67, please change "by reacting by reacting" to -- by reacting --.

<u>Column 5,</u>
Line 5, please change "321 is provided" to -- 319 is provided --.

<u>Column 8,</u>
Line 10, please change "Dependant" to -- Dependent --.

<u>Column 9,</u>
Line 4, please change "$\mu\omega$-cm" to -- $\mu\Omega$-cm --.

<u>Column 10,</u>
Line 36, please change "$(SiCH_8)$" to -- $(SiCH_6)$ --.
Line 50, please change "scam" to -- sccm --.

Signed and Sealed this

Eleventh Day of March, 2003

JAMES E. ROGAN
*Director of the United States Patent and Trademark Office*